United States Patent [19]

Hyde et al.

[11] Patent Number: 4,725,779
[45] Date of Patent: Feb. 16, 1988

[54] NMR LOCAL COIL WITH IMPROVED DECOUPLING

[75] Inventors: James S. Hyde, Dousman, Wis.; Wojciech Froncisz, Krakow, Poland; Andrzej Jesmanowicz, Wauwatosa, Wis.

[73] Assignee: MCW Research Foundation, Inc., Milwaukee, Wis.

[21] Appl. No.: 897,165

[22] Filed: Aug. 15, 1986

Related U.S. Application Data

[63] Continuation-in-part of Ser. No. 731,923, May 8, 1985.

[51] Int. Cl.$^4$ ............................................. G01R 33/20
[52] U.S. Cl. ..................................... 324/318; 333/219; 324/311
[58] Field of Search ............... 324/300, 307, 309, 316, 324/317, 318, 58 C, 58.5 C, 311; 128/653; 332/219, 222, 227

[56] References Cited

U.S. PATENT DOCUMENTS

| | | | |
|---|---|---|---|
| 4,417,209 | 11/1983 | Hounsfield | 324/309 |
| 4,435,680 | 3/1984 | Froncisz et al. | 324/316 |
| 4,446,429 | 5/1984 | Froncisz et al. | 324/316 |
| 4,453,147 | 6/1984 | Froncisz et al. | 324/316 |
| 4,467,282 | 8/1984 | Siebold | 324/309 |
| 4,480,239 | 10/1984 | Hyde et al. | 333/219 |
| 4,504,788 | 8/1985 | Froncisz et al. | 324/316 |
| 4,570,137 | 2/1986 | DiSilvestro | 333/219 |
| 4,623,835 | 11/1986 | Mehdizadeh et al. | 324/316 |

FOREIGN PATENT DOCUMENTS

| | | | |
|---|---|---|---|
| 2448544 | 5/1975 | Fed. Rep. of Germany | 333/219 |
| 2159958 | 12/1985 | United Kingdom | 324/307 |

OTHER PUBLICATIONS

The NMR Blood Flowmeter—Design, Richard E. Halbach et al.; Medical Physics, Jul./Aug. 1981.
Nuclear Magnetic Resonance and Transcutaneous Electromagnetic Blood Flow Measurement, J. H. Battocletti et al., Journal of Microwave Power, 18(3), 1983.
Flat Crossed Coil Detector for Blood Flow Measurement Using Nuclear Magnetic Resonance, J. H. Battocletti et al., Medical and Biological Engineering and Computing, Mar. 1979.

*Primary Examiner*—Stewart J. Levy
*Assistant Examiner*—Kevin D. O'Shea
*Attorney, Agent, or Firm*—Quarles & Brady

[57] ABSTRACT

A local coil for use in NMR imaging includes a pair of loop-gap resonators which are geometrically arranged to be intrinsically isolated. The local coil also includes passive decoupling means to completely decouple the local coil during excitation. In a first embodiment, the pair of loop-gap resonators are disposed axially and the passive decoupling means comprises a pair of back-to-back diodes across the loop-gap resonators. In a second embodiment, the pair of loop-gap resonators are disposed in a plane and the passive decoupling means comprises two single turn loops inside each loop-gap resonator with back-to-back diodes across an open segment of each single turn loop. During excitation, the diodes fire thereby lowering the Q and shifting the resonant frequency of the local coil. Using a combination of intrinsic isolation and passive decoupling, the local coil is completely decoupled from the excitation field. During periods of reception, the diodes revert to their nonconducting state and the intrinsic isolation continues to function providing some degree of noise immunity for the local coil.

9 Claims, 4 Drawing Figures

FUNDAMENTAL MODE

CRC MODE

NMR LOCAL COIL WITH IMPROVED DECOUPLING

CROSS REFERENCE

This application is a continuation-in-part of U.S. patent application Ser. No. 731,923 filed on May 8, 1985.

BACKGROUND OF THE INVENTION

The field of the invention is gyromagnetic resonance spectroscopy, and particularly, local coils which are used in such systems.

Gyromagnetic resonance spectroscopy is conducted to study nuclei that have magnetic moments and electrons which are in a paramagnetic state. The former is referred to in the art as nuclear magnetic resonance (NMR), and the latter is referred to as paramagnetic resonance (EPR) or electron spin resonance (ESR). There are other forms of gyromagnetic spectroscopy that are practiced less frequently, but are also included in the field of this invention.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus).

When a substance such as human tissue is subjected to a uniform magnetic field (polarizing field $B_z$) the individual magnetic moments of the paramagnetic nuclei in the tissue attempt to align with this field, but precess about it in random order at their characteristic Larmor frequency. A net magnetic moment $M_z$ is produced in the direction of the polarizing field, but the randomly oriented components in the perpendicular plane (x-y plane) cancel one another. If, however, the substance, or tissue, is irradiated with a magnetic field (excitation field $B_1$) which is in the x-y plane and which is near the Larmor frequency, the net aligned moment, $M_z$, can be rotated into the x-y plane to produce a net transverse magnetic moment $M_1$ which is rotating in the x-y plane at the Larmor frequency. The degree to which the rotation of $M_z$ into an $M_1$ component is achieved, and hence, the magnitude and the direction of the net magnetic moment ($M = M_0 + M_1$) depends primarily on the length of time of the applied excitation field $B_1$.

The practical value of this gyromagnetic phenomena resides in the radio signal which is emitted after the excitation signal $B_1$ is terminated. When the excitation signal is removed, an oscillating sine wave referred to as an NMR signal is induced in a receiving coil by the rotating field produced by the transverse magnetic moment $M_1$. The frequency of this signal is the Larmor frequency, and its initial amplitude, $A_0$, is determined by the magnitude of $M_1$.

The NMR systems which implement these techniques are constructed in a variety of sizes. Small, specially designed machines, are employed to examine laboratory samples or animals, or to examine specific parts of the human body. On the other hand, "whole body" NMR scanners are sufficiently large to receive an entire human body and examine any portion thereof. The NMR signals received may be used to identify the presence and relative concentration of substances within the field of view by the characteristic NMR frequencies, or "signatures" of known atomic structures. By scanning many points within the field of view an entire image can be constructed, which is particularly useful for anatomical studies.

Whole body scanners may employ a separate excitation coil and local coil for transmitting the excitation field and receiving the NMR signal, respectively. The excitation coil produces a highly uniform, or homogeneous, excitation field throughout the area of interest, which is a principal advantage of a whole body scanner. The local coil is placed near the area of interest to receive the NMR signal. The local coil consists of a resonator which is sharply tuned to the Larmor frequency of the nuclei of interest.

Recently a novel resonator structure, referred to in the art as a "loop-gap" resonator, has been applied to the field of gyromagnetic resonance spectroscopy. As indicated in U.S. Pat. Nos. 4,435,680; 4,446,429, 4,480,239 and 4,504,788, the loop-gap resonator may take a wide variety of shapes. In all cases, however, a lumped circuit resonator is formed in which a conductive loop is the inductive element and one or more gaps are formed in this loop to form a capacitive element. While the loop-gap resonator has many desirable characteristics normally associated with lumped circuit resonators, it also has some characteristics normally associated with cavity resonators. Most notable of these is the much higher quality factor, or "Q", of the loop-gap resonator over the traditional lumped circuit resonators.

A major technical problem in NMR systems is decoupling the local coil during the excitation portion of the measurement cycle. Decoupling is necessary to prevent distortion of the excitation field and to prevent potential damage to receiver input circuits by large voltages from the local coil. This problem is compounded by the very high Q of the local coils, especially those employing loop-gap resonators.

SUMMARY OF THE INVENTION

The present invention relates to the design of a local coil for receiving NMR signals in which the local coil is isolated from the excitation field and yet is very sensitive to the NMR signals which result from such excitation. To achieve this result, a local coil of the present invention employs a combination of intrinsic isolation and passive decoupling. The intrinsic isolation is provided by using a pair of loop-gap resonators which because of their size, shape, and relative orientation do not couple to uniform components of the excitation field. A teaching of the present invention is that due to imperfections in the intrinsic isolation attainable through geometric means alone, further decoupling is required during excitation. In addition to intrinsic isolation, passive decoupling is provided during periods of excitation, lowering the Q and shifting the resonant frequency of the local coil thereby completely decoupling it from the excitation field.

A general object of this invention is to provide a local coil with superior isolation from the excitation field. The combination of intrinsic isolation and passive decoupling achieve such superior isolation. During excitation, the passive decoupling de-tunes the local coil so that the excitation field remains uniform throughout the area of interest. Then, when the excitation is removed to receive the NMR signals, the passive decoupling is inoperative while the intrinsic isolation continues to provide immunity from noise sources with uniform fields. Noise from outside the area of interest is therefore rejected by the local coil.

The pair of loop-gap resonators may be disposed along a common axis, in which case the pair of loop-gap resonators will exhibit a resonance mode characterized by Counter Rotating Currents (CRC). The CRC mode provides the intrinsic isolation and is tuned to the frequency of the NMR signals of interest. For the CRC pair, the passive decoupling can be provided by a pair of back-to-back diodes connected across the loops of the CRC pair. When the voltage between the loops rises due to non-uniform components of the excitation field, the diodes fire to effectively short the loops together thereby decoupling the CRC pair. During reception, the diodes revert to their non-conducting state and are effectively out of the circuit.

The CRC pair may also resonate in a lower frequency fundamental mode. A further object of the invention is to positively surpress the fundamental mode by cross connecting the plates of the capacitive elements formed by the gaps of the loop-gap resonators. When so connected, the CRC pair can resonate only in the CRC mode, which insures mode purity in the event noise sources attempt to excite the fundamental mode.

The pair of loop-gap resonators may also be disposed adjacent to one another. In that configuration, the plates formed by the gaps of the loop-gap resonators are connected in parallel. This arrangement also provides intrinsic isolation to a uniform magnetic field. For adjacent loops, passive decoupling can be provided by including a conductive loop in the interior of each loop-gap resonator. Each conductive loop has an open segment which is bridged by a pair of back-to-back diodes. Non-uniform components of the excitation field causes the voltage across the open segment of the conductive loops to rise until the diodes fire, thereby shorting the conductive loops and decoupling the local coil.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Whole body excitation for NMR measurements has the advantage of producing a nearly uniform excitation field. A local coil is then used to detect the NMR signal when the excitation field is removed. The local coil is tuned to the frequency of the excitation field. If the local coil is not decoupled during excitation, then the excitation field would be distorted in the field of view of the local coil. It is therefore necessary to decouple the local coil from the excitation field during periods of excitation.

To provide the required isolation, a local coil of the present invention utilizes a combination of intrinsic isolation and passive decoupling. As will be described in detail below, intrinsic isolation is provided by the geometric arrangement of a pair of loop-gap resonators. It is an important discovery of this invention, however, that eddy currents in the sample being scanned and other sources of error cause imperfections in the homogeniety of the excitation field which results in imperfect isolation by intrinsic means alone. Passive decoupling is used in a local coil of the present invention to augment the intrinsic isolation to achieve superior isolation.

Figure 1A:
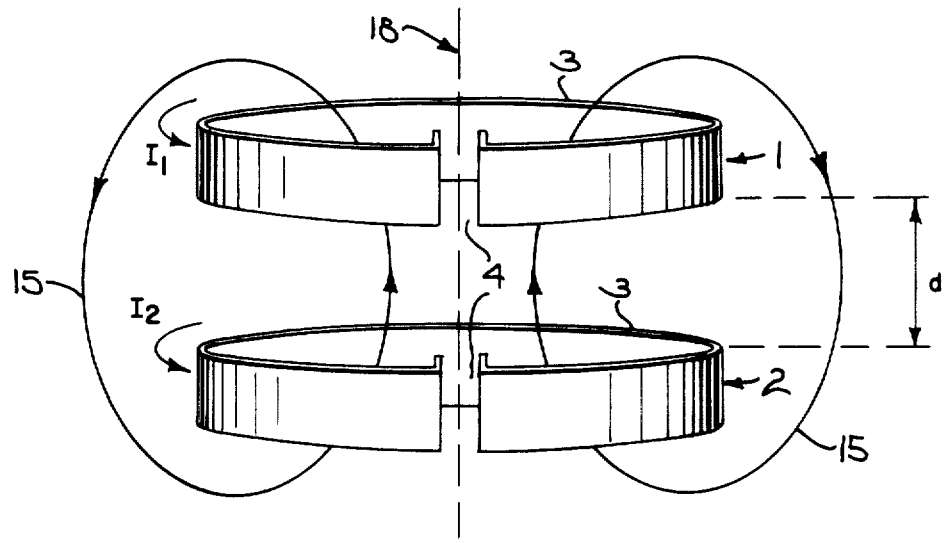
FIG. 1a is an elevation view of an axial pair of loop-gap resonators operating in the fundamental mode.
Figure 1B:
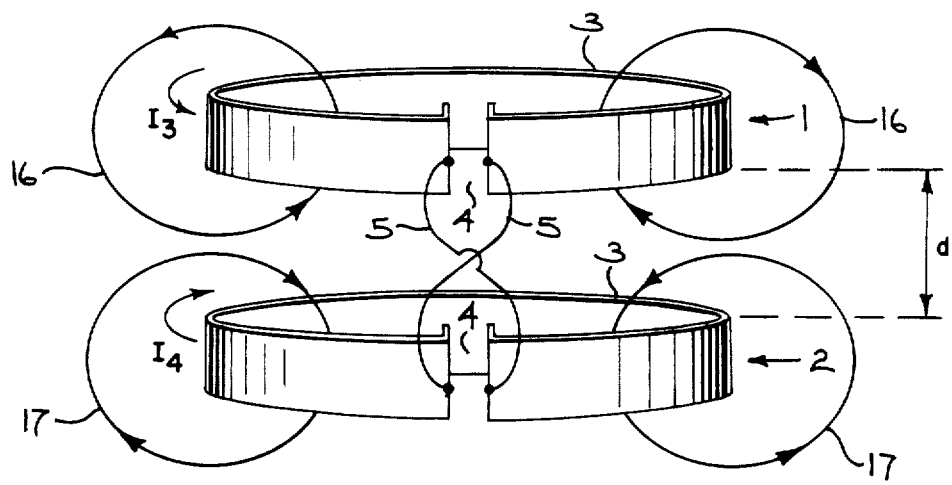
FIG. 1b is an elevation view of an axial pair of loop-gap resonators operating in the counter rotating current (CRC) mode.

Referring to FIGS. 1a and 1b, an axial pair of loop-gap resonators 1 and 2 can operate in two distinct resonance modes. The two resonance modes are distinguished by the relative phase of the currents in the pair of loops. In FIG. 1a, the resonant currents $I_1$ and $I_2$ in the two loops 3 are in phase, or parallel. This is the fundamental mode which results in flux lines 15 which link both loops 3. In the other resonant mode of FIG. 1b, the resonant currents $I_3$ and $I_4$ are out of phase, or antiparallel. This situation is characterized by Counter Rotating Currents (CRC) in the loops and is designated herein as the CRC mode. In the CRC mode, separate flux lines 16 and 17 flow through each loop 3 in opposite directions. The voltages produced across the gaps by the flux lines 16 and 17 are equal and opposite.

The two resonance modes of FIGS. 1a and 1b occur at different frequencies; the fundamental mode at a lower frequency and the CRC mode at a higher frequency. If the two loops 3 are far apart, the mutual inductance between the loops is low and the resonant frequencies of the two modes tend to coincide, or become degenerate. If the two loops are close, the mutual inductance between the loops causes the modes to split, or diverge in resonant frequency.

In FIG. 1a, a homogeneous excitation field polarized along the common axis of the pair indicated by dashed line 18 would couple to both loops of the pair operated in the fundamental mode and there would be no isolation. However, in the CRC mode of FIG. 1b, a homogeneous excitation field does not couple to the pair, regardless of the polarization of the excitation. Intrinsic isolation is therefore achieved by operating in the CRC mode.

The CRC mode is enforced by spacing the loops 3 closely to split the resonant frequencies well apart. Then the higher resonant frequency of the CRC mode is tuned to the resonant frequency of the nuclei of interest. The lower fundamental resonant frequency is therefore not excited. It is further possible to force the suppression of the fundamental mode by connecting each plate of one gap 4 to the opposite plate of the other gap 4 with crossed wires 5 such that the current flow of FIG. 1b is forced. The crossed wires 5 are not absolutely required for mode suppression, but are generally preferred to guarantee mode purity.

The intrinsic isolation provided by a CRC pair of loop-gap resonators 1 and 2 is relient upon a perfectly homogenous excitation field. In actual practice, the excitation field through the pair of loop-gap resonators 1 and 2 is not perfectly homogeneous. First of all, eddy currents in the subject being measured seriously affect the homogeniety of the excitation field. Secondly, in an axial pair as described above, one loop 3 is much closer to the subject being scanned than the other loop 3. As a result, some excitation flux tends to emerge through the space "d" between the loops and the currents $I_3$ and $I_4$ in the two loops tend not to be precisely equal. The excitation field can then tend to excite resonance in the CRC pair, resulting in severe distortion of the excitation field. It is an important discovery of this invention that intrinsic isolation alone does not completely decouple the CRC pair from the excitation field.

Figure 2:
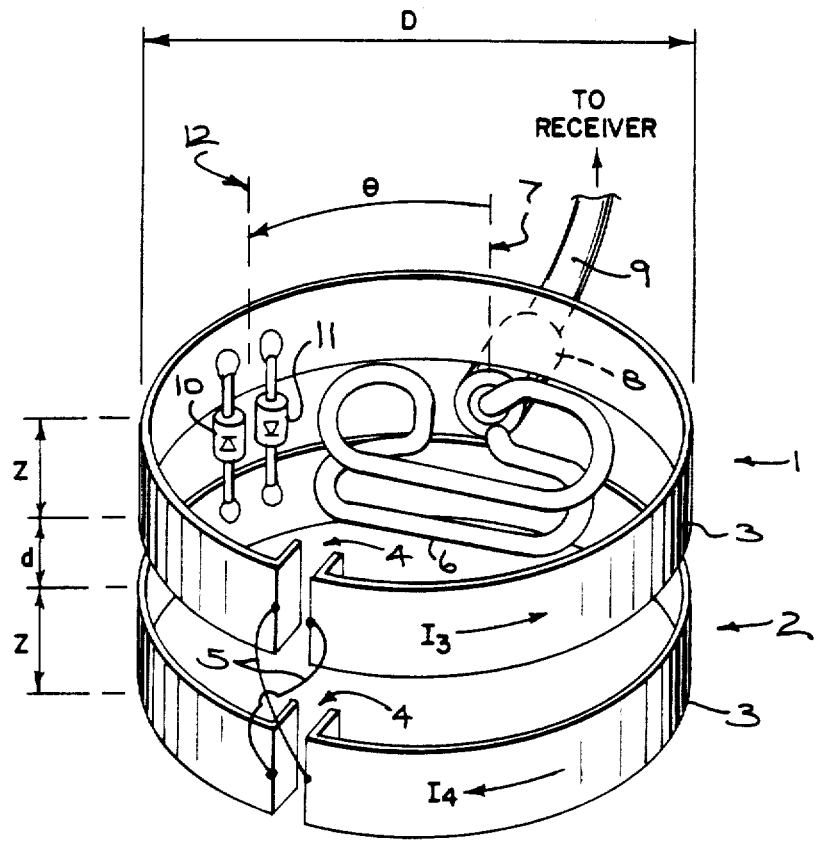
FIG. 2 is a perspective view of a CRC type local coil of the present invention.

Referring to FIG. 2, passive decoupling is accomplished in the CRC pair by connecting a pair of diodes 10 and 11 across the two loops 3 of the CRC pair. The diodes 10 and 11 are connected with alternate polarities in what is termed herein as a back-to-back configuration. During excitation, the voltage between the loops 3 rises until the threshold voltage of the diodes 10 and 11 is reached. At that point, the diodes 10 and 11 begin conducting and the quality factor, or Q, of the CRC pair is sharply lowered. Also, a shift in the resonant frequency of the CRC pair occurs due to the change in geometry caused by the effective short circuit of the conducting diodes 10 and 11. The shift in resonance and low Q value serves to decouple the CRC pair from the excitation field.

During the receive period, the excitation field is removed in order to detect the NMR signal. The NMR signal is very low level, well below the threshold of the back-to-back diode 10 and 11. The diodes 10 and 11 therefore remain non-conducting during the receive period.

A local coil of the present invention is particularly effective during the receive period because the intrinsic isolation continues to function. Even though the intrinsic isolation is not perfect, it is nevertheless effective in reducing noise which may eminate from sources outside the field of view such as, for example, the whole body coil.

DESCRIPTION OF THE PREFERRED EMBODIMENT

Referring to FIG. 2, a local coil of the present invention includes a pair of loop-gap resonators 1 and 2. Each resonator 1 and 2 is comprised of a loop of conductive material 3 which serves as an inductive element and a gap 4 formed by parallel plates of conductive material which serves as a capacitive element. Details of loop-gap resonator geometry are generally known in the art and also described in U.S. patent application Ser. No. 731,923 filed May 8, 1985, and assigned to the assignee of the present invention, the contents of which are herein incorporated by reference.

The two loop-gap resonators 1 and 2 are aligned axially to form a CRC pair and are separated by a distance d. The width of the conductive loops 3 is Z and the diameter of the loops 3 is D. The values D, d, and Z preferred for this embodiment are 7.5 cm, 0.8 cm, and 1.25 cm respectively. The parameters D, d, and Z can vary significantly to produce local coils of different diameters, D, ranging from about 5 cm to about 15 cm by changing d and Z proportionately.

The conductive loops 3 are formed on the inside surface of a section of polyvinylchloride (PVC) tubing (not shown) having an appropriate inside diameter using adhesive backed copper foil type no. 1151 manufactured by 3M company. The gaps 4 are formed from double sided printed circuit board material, which is readily available in the art. The printed circuit board material is bonded edgewise on the inside of the PVC tubing to form the capacitive element of each loop-gap resonator 1 and 2. The copper foil on each side of the circuit board serves as a plate of the capacitive element and is bonded to one end of the respective conductive loop 3. The printed circuit board material is trimmed in size to tune the CRC mode of the local coil to the resonant frequency of the gyromagnetic material of interest, typically near 64 MHz. To force the resonators 1 and 2 into the CRC mode as described above, a pair of crossed wires 5 are used to connect opposite plates of the capacitive elements of the resonators 1 and 2.

A coupling structure 6 is preferred to couple the NMR signal from the loop-gap resonators 1 and 2 to a transmission line 9. The coupling structure 6 is formed from a folded loop of solid copper wire. The folded loop structure consists of an upper portion and a lower portion which are parallel to each other. Like the CRC pair, the folded loop structure itself possesses the property of intrinsic isolation. A uniform field of arbitrary polarization does not interact with the coupling structure 6. The currents in the upper and lower portions of the coupling structure 6 are opposite in direction, thus permitting coupling to the CRC mode of the resonators 1 and 2 when the coupler lies midway between the loops 3. Other types of coupling may also be used with this invention. For example, the NMR signal may be taken directly off from one of the gaps 4 by connecting a pair of lead wires (not shown).

The coupling structure 6 is mounted between the loops 3 at a position indicated by dashed line 7 which is directly across from the gaps 4. Because it lies midway between the plates of the capacitor, the line 7 represents the position of zero voltage between the loops 3. By mounting the coupling structure 6 at the zero potential line 7, voltage insulation problems are reduced. The coupling structure is bonded to a standard BNC connector 8, well known in the art, for connection through the transmission line 9 to a receiver (not shown). The receiver amplifies, detects, and processes the signals in well known fashion.

A pair of diodes 10 and 11 are connected across the loops 3 to provide passive decoupling during excitation as described above. The diodes 10 and 11 are of the fast recovery type, suitable for use at VHF frequencies, with type UES 1101 being preferred in this embodiment. The diodes 10 and 11 are connected back-to-back with the cathode of diode 10 and the anode of diode 11 being connected to resonator 1, while the anode of diode 10 and the cathode of diode 11 are connected to resonator 2. The diodes 10 and 11 are connected to the loops 3 next to each other at a position indicated by dashed line 12. The position at line 12 is displaced from the zero potential line 7 by an angle $\theta$. There is considerable flexibility in the angle $\theta$ at which the diodes 10 and 11 are attached. The voltage across the loops 3 is zero at line 7 and rises to a maximum at the gaps 4. The angle $\theta$ must be selected large enough so that the voltage at line 12 during excitation is greater than the threshold of the diodes 10 and 11 so that the diodes 10 and 11 fire and the desired decoupling occurs. An angle $\theta$ of about 45 degrees has been found to be satisfactory for this embodiment.

Since the loop-gap resonators are electrically isolated, it is necessary to provide a return current path for the diodes 10 and 11. In the embodiments of FIG. 2, the crossed wires 5 not only suppress the fundamental mode, but also provide the return current path for the diodes 10 and 11. It is also possible to provide the return current path by connecting a second pair of back-to-back diodes (not shown) across the loops 3 on the other side of the zero voltage line 7, e.g. at an angle of minus θ.

Figure 3:
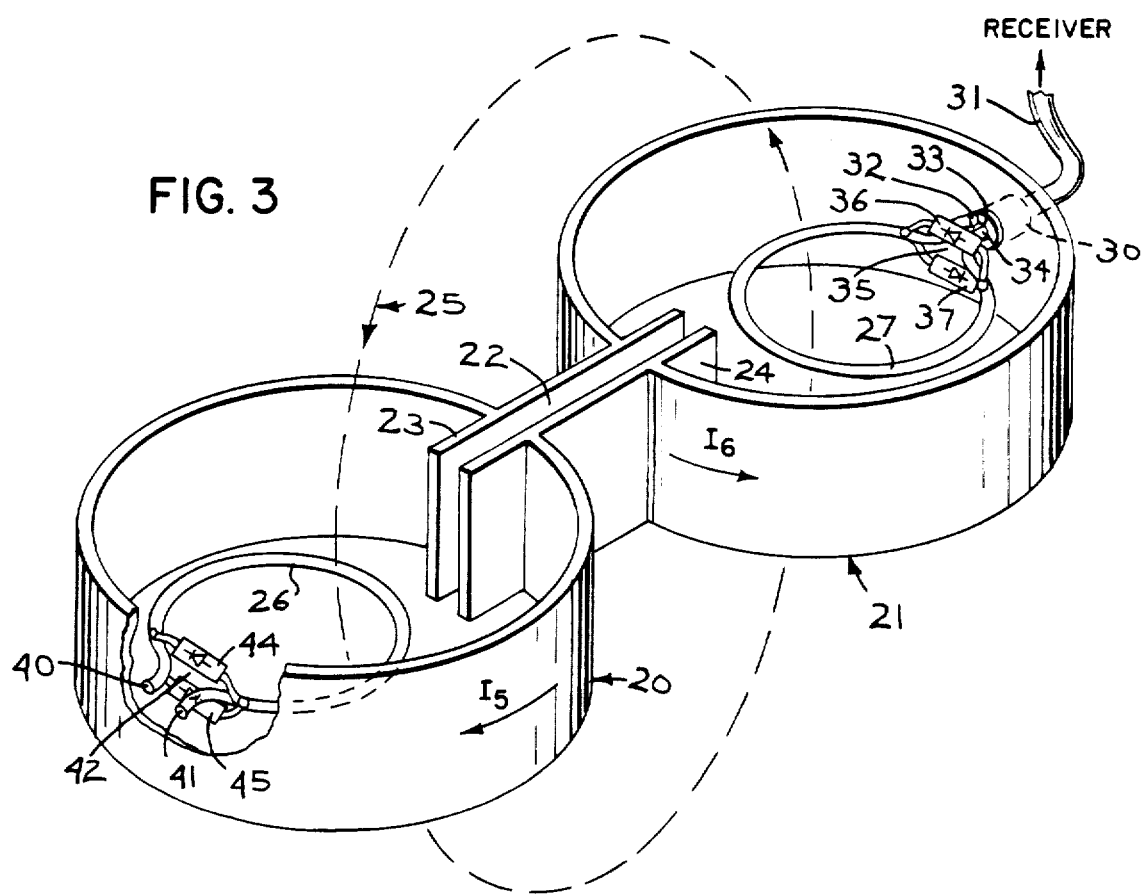
FIG. 3 is a perspective view of a second preferred embodiment of the invention in a planar pair type local coil with part of one loop cut away.

Referring to FIG. 3, a second embodiment of the invention includes two loop-gap resonators 20 and 21 arranged side-by-side in what is termed herein as a planar pair configuration. A gap 22 common to both resonators 20 and 21 is formed by plates 23 and 24 which function as the capacitive elements and also connect the resonators 20 and 21 together. The planar pair is constructed in a manner similar to that described above for the CRC local coil, using adhesive backed copper foil inside PVC tubing for the loops and double sided printed circuit board material for the capacitive elements. The loop-gap resonators 20 and 21 are approximately four inches in diameter and one-half inch wide in this embodiment, although a wide variety of dimensions can be used. Because the plates 23 and 24 are common to both resonators, the currents $I_5$ and $I_6$ are forced to be in opposite directions. As a result, the paths for magentic flux through the resonators 20 and 21 as indicated by dashed line 25 is also in opposite directions. Therefore, the planar pair also possesses the property of intrinsic isolation as it does not couple to a uniform magnetic field.

Still referring to FIG. 3, passive decoupling for the planar pair is accomplished using conductive loops 26 and 27 in the interior of each resonator 20 and 21, respectively. Each conductive loop 26 and 27 is approximately two inches in diameter for this embodiment. One of the conductive loops 27 functions as a pick-up loop to couple the received NMR signal through a coaxial connector 30 to a coaxial cable 31. The other end of the coaxial cable 31 connects to a receiver (not shown), where the NMR signal is detected and processed in well known fashion. One end 32 of the pick-up loop 27 is attached onto the outer rim 33 of the coaxial connector 30, while the other end 34 of the pick-up loop 27 is attached to the center terminal (not shown) of the coaxial connector 30. The connection of the two ends 32 and 34 of the pick-up loop 27 to the coaxial connector 30 provides both physical support for the pick-up loop 27 and electrical isolation for the two ends 32 and 34. Thus, the pick-up loop 27 contains an open segment shown generally at 35 across the ends 32 and 34. A pair of back-to-back diodes 36 and 37 are connected across the open segment 35.

In order to maintain the integrity of the intrinsic isolation in the planar pair, it is critical to maintain symmetry between the loop-gap resonators 20 and 21. The second conductive loop 26 is used for this purpose, acting only as a dummy loop to provide symmetry for the pick-up loop 27. The dummy loop 26 therefore has dimensions identical to the pick-up loop 27 and is mounted in a position symmetrical to the pick-up loop 27. The dummy loop 26 has two ends 40 and 41 which are anchored into the PVC tubing which forms an insulating wall (not shown) of loop-gap resonator 20 and are insulated from the copper foil on the inside of the insulating wall. The dummy loop 26 therefore contains an open segment shown generally at 42 across the ends 40 and 41. Another pair of back-to-back diodes 44 and 45 are connected across the open segment 42. Type UES 101 diodes as described above are also suitable for this embodiment for diodes 36-37 and 44-45.

During excitation, non-uniform components of the excitation field cause the voltage across the open segments 35 and 42 to rise until the threshold voltage of the back-to-back diodes 36-37 and 44-45 is reached. Then the diodes 36-37 and 44-45 begin conducting, thereby effectively changing the pick-up loop 26 and dummy loop 27 into shorted turns. This results in a sharp lowering of the Q and shifting of the resonant frequency of the planar pair, thereby decoupling it from the excitation field. After the excitation field is removed to receive the NMR signals, the diodes 36-37 and 44-45 revert to their non-conducting state and are effectively out of the circuit. The NMR signal is then coupled by the pick-up loop 26 into the coaxial cable 31.

There has been described above two embodiments of the invention in CRC pair and planar pair local coils. It should be apparent to one skilled in the art that other configurations of loop-gap resonators possesss the property of intrinsic isolation and are therefore useable for this invention in combination with suitable passive decoupling. For example, the planar pair described in the second embodiment above could be modified to construct a butterfly pair by inclining both ends of each loop-gap resonator slightly with respect to the common plane. Similarly, both embodiments described above have a single gap in each loop-gap resonator. It should be appreciated by one skilled in the art that loop-gap resonators with multiple gaps can also be used to form intrinsically isolated pairs, and passively decoupled to form a local coil of the present invention. The passive decoupling can also be accomplished by many different ways. For example, in the second embodiment the cable to the receiver could be connected directly to the plates of the common gap to detect the NMR signal. The pick-up loop would then function as a second dummy loop for passive decoupling purposes.

We claim:

1. A local coil for receiving NMR signals from a subject comprising:
   a first loop-gap resonator;
   a second loop-gap resonator connected to and arranged relative to the first loop-gap resonator to form a pair of loop-gap resonators which is intrinsically isolated from a uniform magnetic field; and
   passive decoupling means coupled to the first and second loop-gap resonators for decoupling the pair of loop-gap resonators from a non-uniform magnetic field.

2. A local coil as recited in claim 1 in which the pair of loop-gap resonators are disposed on a common axis and exhibit a Counter Rotating Current (CRC) resonance mode which is tuned to the frequency of the NMR signals.

3. A local coil as recited in claim 2 in which the passive decoupling means includes a pair of back-to-back diodes connected across the loops of said pair of loop-gap resonators.

4. The local coil as recited in claims 2 or 3 which further includes a pair of crossed wires which connect opposite plates of capacitive elements formed by gaps in the pair of loop-gap resonators, whereby the pair of loop-gap resonators are forced to resonate in the CRC mode.

5. The local coil as recited in claims 2 or 3 which includes coupling means comprised of a folded loop conductor positioned at a zero potential line located opposite the gaps of the pair of loop-gap resonators and midway between the loop-gap resonators.

6. A local coil as recited in claim 1 in which the pair of loop-gap resonators are disposed adjacent to one another and a single pair of plates forms a gap common to both resonators.

7. A local coil as recited in claim 6 in which the passive decoupling means includes a pair of conductive loops with each conductive loop disposed in the interior of one of said pair of loop-gap resonators, and with each conductive loop containing an open segment which is bridged by a pair of back-to-back diodes.

8. A local coil as recited in claims 6 or 7 in which the pair of loop-gap resonators are in the same plane to form a planar pair of loop-gap resonators.

9. A local coil as recited in claim 7 in which one of said conductive loops is connected as a pick-up loop for the NMR signal by connecting a pair of signal wires across the open segment of the pick-up loop.

* * * * *

UNITED STATES PATENT AND TRADEMARK OFFICE
CERTIFICATE OF CORRECTION

PATENT NO. : 4,725,779
DATED : February 16, 1988
INVENTOR(S) : James S. Hyde et al.

It is certified that error appears in the above—identified patent and that said Letters Patent is hereby corrected as shown below:

In Column 1, after the cross reference ending on line 7, insert
--The U. S. Government has a paid-up license in this invention and the right in limited circumstances to require the patent owner to license others on reasonable terms as provided for by the terms of Grant No. GM27665 awarded by the National Institute of Health.--.

Signed and Sealed this

Fifth Day of July, 1988

*Attest:*

DONALD J. QUIGG

*Attesting Officer*  *Commissioner of Patents and Trademarks*